United States Patent
Shirafuji

(10) Patent No.: US 9,295,160 B2
(45) Date of Patent: Mar. 22, 2016

(54) PRINTED CIRCUIT BOARD AND METHOD OF MANUFACTURING THE SAME

(71) Applicant: Nitto Denko Corporation, Ibaraki-shi, Osaka (JP)

(72) Inventor: Youhei Shirafuji, Ibaraki (JP)

(73) Assignee: NITTO DENKO CORPORATION, Ibaraki-shi, Osaka (JP)

(*) Notice: Subject to any disclaimer, the term of this patent is extended or adjusted under 35 U.S.C. 154(b) by 325 days.

(21) Appl. No.: 13/774,544

(22) Filed: Feb. 22, 2013

(65) Prior Publication Data

US 2013/0228360 A1 Sep. 5, 2013

Related U.S. Application Data

(60) Provisional application No. 61/612,619, filed on Mar. 19, 2012.

(30) Foreign Application Priority Data

Mar. 2, 2012 (JP) ................................ 2012-046570

(51) Int. Cl.
*H05K 3/00* (2006.01)
*H05K 1/02* (2006.01)
*H05K 3/44* (2006.01)

(52) U.S. Cl.
CPC ............... *H05K 3/0023* (2013.01); *H05K 1/02* (2013.01); *H05K 3/0082* (2013.01); *H05K 3/445* (2013.01)

(58) Field of Classification Search
CPC ... H05K 3/0023; H05K 3/0017; H05K 3/002; H05K 3/0026; H05K 3/0029; H05K 3/0032; H05K 3/0035; H05K 3/0038; H05K 3/0041
See application file for complete search history.

(56) References Cited

U.S. PATENT DOCUMENTS

| | | |
|---|---|---|
| 2002/0007961 A1 | 1/2002 | Yamato et al. |
| 2008/0170333 A1 | 7/2008 | Ohsawa et al. |
| 2010/0224391 A1 | 9/2010 | Tamura et al. |
| 2013/0157200 A1 | 6/2013 | Tamura et al. |

FOREIGN PATENT DOCUMENTS

| | | |
|---|---|---|
| JP | 2001-352137 A | 12/2001 |
| JP | 2002185138 A | 6/2002 |
| JP | 2007095136 A | 4/2007 |
| JP | 2008172012 A | 7/2008 |
| JP | 2010205361 A | 9/2010 |

OTHER PUBLICATIONS

Office Action issued Sep. 29, 2015 in JP Application No. 2012046570.

*Primary Examiner* — Jeremy C Norris
(74) *Attorney, Agent, or Firm* — Panitch Schwarze Belisario & Nadel LLP

(57) ABSTRACT

Gradation exposure is performed on an insulating layer by irradiating the insulating layer with exposure light using a photomask having a partial light-transmitting region that is configured to be partially transmittable of the exposure light. After the gradation exposure, development processing is performed on the insulating layer such that a recess is formed in a portion of the insulating layer that has been irradiated with the exposure light through the partial light-transmitting region. The partial light-transmitting region of the photomask has a plurality of first holes that are transmittable of the exposure light and a plurality of second holes that are arranged to surround the plurality of first holes and transmittable of the exposure light, and the area of each second hole is larger than the area of each first hole.

12 Claims, 9 Drawing Sheets

F I G. 2
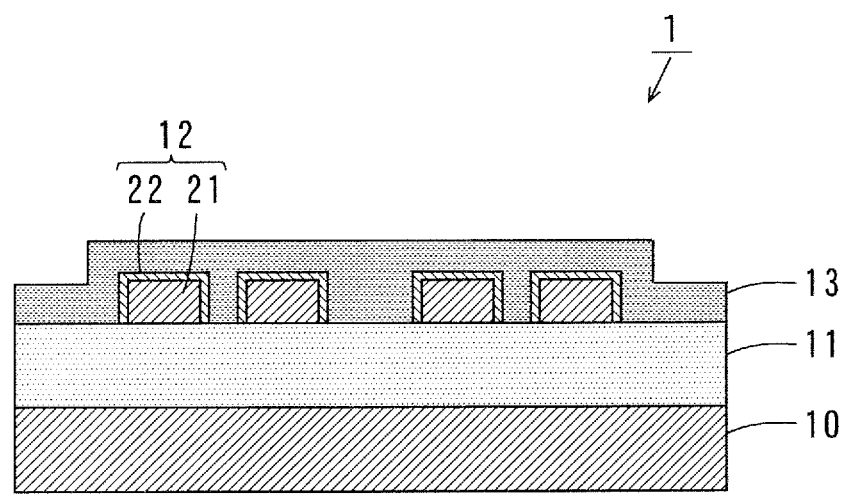

F I G. 5 (a)
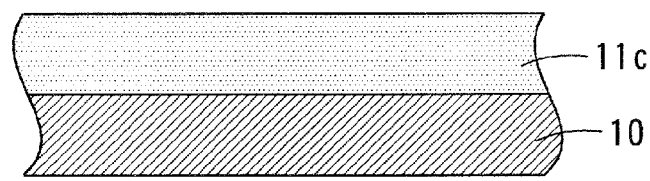
F I G. 5 (b)
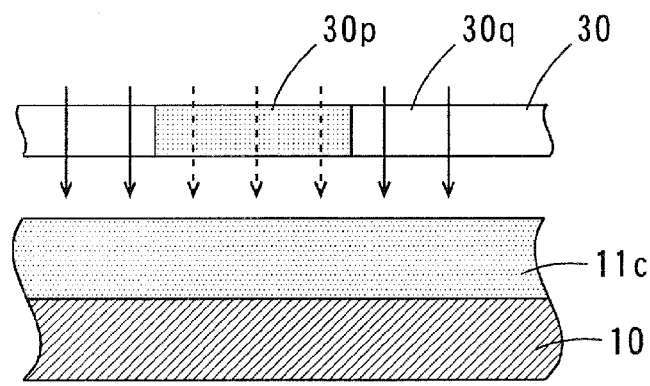
F I G. 5 (c)
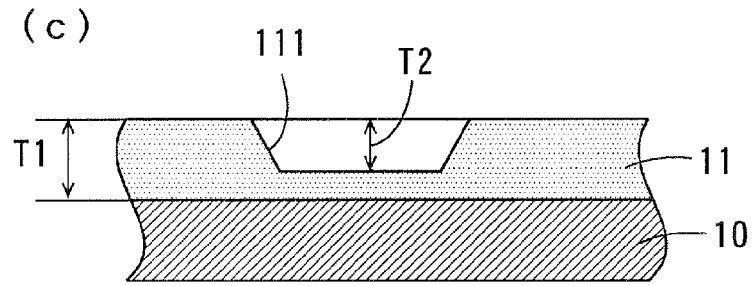
F I G. 5 (d)
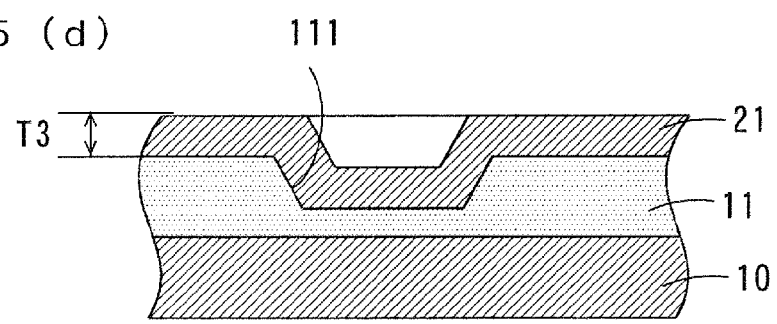

PRINTED CIRCUIT BOARD AND METHOD OF MANUFACTURING THE SAME

BACKGROUND OF THE INVENTION (1) Field of the Invention

The present invention relates to a printed circuit board and a method of manufacturing the printed circuit board.

(2) Description of Related Art

Actuators are used in drives such as hard disc drives. Such an actuator includes an arm provided rotatably around a rotation shaft, and a suspension board with a circuit that is attached to the arm. The suspension board with a circuit is a printed circuit board for positioning the magnetic head at a desired track of a magnetic disc.

A suspension board with a circuit described in JP 2001-352137 A has connection terminals for connection to a magnetic head and connection terminals for connection to an external circuit. The connection terminals for connection to the magnetic head and the connection terminals for connection to the external circuit are formed as flying leads with the both sides exposed.

In fabricating this suspension board with a circuit, a film made of photosensitive resin is formed on a support substrate, and a base layer having a predetermined pattern is formed by performing exposure processing and development processing on the film. In this case, gradation exposure is performed using a photomask, whereby openings having a smaller thickness than the remaining portion are formed in the base layer. Thereafter, conductor layers are formed on the base layer so as to extend through the insides of the openings, and a cover layer is formed on the conductor layers.

Further, portions of the cover layer that correspond to the openings of the base layer are opened such that the surfaces of the conductor layers are exposed. Further, openings are formed in portions of the support substrate that correspond to the openings of the base layer and the openings of the base layer are penetrated such that the back surfaces of the conductor layers are exposed. Metal plating layers are formed on both sides of the exposed portions of the conductor layers. Thus, the connection terminals for connection to the magnetic head and the connection terminals for connection to the external circuit are formed.

BRIEF SUMMARY OF THE INVENTION

In the manufacturing method described above, portions of the film where the openings are to be formed may excessively be dissolved, and holes that penetrate the bottom surfaces of the openings may be formed at the time of the development processing for the film on the support substrate. In this case, when the openings are formed in the support substrate in the following step, portions of the conductor layers formed in the openings may be removed through the holes in the openings.

An object of the present invention is to provide a printed circuit board in which formation of a hole in an insulating layer during gradation exposure is prevented and a method of manufacturing the printed circuit board.

(1) According to one aspect of the present invention, a method of manufacturing a printed circuit board that includes an insulating layer and a conductor layer having a predetermined pattern includes the steps of performing gradation exposure to irradiate the insulating layer with exposure light using a photomask having a partial light-transmitting region that is configured to partially transmit the exposure light, and performing development processing on the insulating layer such that a recess is formed in a portion of the insulating layer that has been irradiated with the exposure light through the partial light-transmitting region, wherein the partial light-transmitting region of the photomask includes a first region, and a second region that is provided to surround the first region, and an average transmission amount of exposure light per unit area of the second region is larger than an average transmission amount of the exposure light per unit area of the first region.

In this manufacturing method, the gradation exposure is performed on the insulating layer using the photomask having the partial light-transmitting region that is configured to partially transmit the exposure light. Thereafter, the development processing is performed on the insulating layer. Thus, the recess is formed in the portion of the insulating layer that has been irradiated with the exposure light through the partial light-transmitting region.

In the partial light-transmitting region of the photomask, the second region is provided to surround the first region. In this case, the average transmission amount of the exposure light per unit area of the second region is larger than the average transmission amount of the exposure light per unit area of the first region.

Thus, a periphery of the portion of the insulating layer that is irradiated with the exposure light through the partial light-transmitting region, more likely to be dissolved during the development processing, is irradiated with a larger amount of the exposure light than the remaining region. Therefore, excessive dissolution of the periphery during the development processing is prevented. As a result, formation of a hole that penetrates the bottom surface of the recess of the insulating layer is prevented.

(2) The recess of the insulating layer may have an inner side surface and a bottom surface, and a thickness of a portion of the insulating layer that constitutes the bottom surface may be constant.

In this case, the thickness of the insulating layer that constitutes the bottom surface of the recess of the insulating layer can be constant while formation of the hole that penetrates the bottom surface of the recess of the insulating layer is prevented by using the photomask described above.

(3) The partial light-transmitting region of the photomask may have a plurality of first light-transmitting portions that are arranged in the first region and transmittable of the exposure light, and a plurality of second light-transmitting portions that are arranged in the second region and transmittable of the exposure light, and a transmission amount of the exposure light through each second light-transmitting portion may be larger than a transmission amount of the exposure light through each first light-transmitting portion.

In this case, the average transmission amount of the exposure light per unit area of the second region can be made larger than the average transmission amount of the exposure light per unit area of the first region with a simple configuration.

(4) The transmission amount of the exposure light through each second light-transmitting portion may be not less than 1.1 times and not more than 1.5 times of the transmission amount of the exposure light through each first light-transmitting portion.

In this case, the insulating layer can be appropriately irradiated with the necessary amount of the exposure light through the plurality of first and second light-transmitting portions. Thus, the recess of the insulating layer can be well formed.

(5) Each first light-transmitting portion and each second light-transmitting portion may be circular, respectively.

In this case, the plurality of first and second light-transmitting portions can be accurately formed in fabricating the photomask.

(6) A diameter of each first light-transmitting portion is not less than 4 μm and not more than 14 μm.

In this case, the diameter of each first light-transmitting portion is not less than 4 μm, whereby the diameters of the plurality of first light-transmitting portions are prevented from having variation in fabricating the photomask. Further, the diameter of each first light-transmitting portion is not more than 14 μm, whereby the insulating layer can be appropriately irradiated with the necessary amount of the exposure light through the plurality of first light-transmitting portions during the gradation exposure for the insulating layer.

(7) A distance between a central point of one first light-transmitting portion and a central point of another first light-transmitting portion that is the closest to the one first light-transmitting portion may be not less than 6 μm and not more than 28 μm.

In this case, the insulating layer can be appropriately irradiated with the necessary amount of the exposure light through the plurality of first light-transmitting portions.

(8) A distance between a central point of one second light-transmitting portion and a central point of another second light-transmitting portion that is the closest to the one second light-transmitting portion may be not less than 6 μm and not more than 28 μm.

In this case, the insulating layer can be appropriately irradiated with the necessary amount of the exposure light through the plurality of second light-transmitting portions.

(9) The plurality of first and second light-transmitting portions may form a plurality of rows, and a plurality of first and second light-transmitting portions in one row of the plurality of rows and a plurality of first and second light-transmitting portions in another row adjacent to the one row may be arranged in a staggered manner.

In this case, the insulating layer can be evenly irradiated with the exposure light through the plurality of first light-transmitting portions, and the insulating layer can be evenly irradiated with the exposure light through the plurality of second light-transmitting portions. Therefore, the recess of the insulating layer can be appropriately formed.

(10) The insulating layer may be formed on a conductive support substrate and may have a first surface that is to be irradiated with the exposure light and a second surface that is in contact with the conductive support substrate, and the method may further include the steps of forming the conductor layer to extend to an inside of the recess of the insulating layer and on the first surface of the insulating layer after the development processing, forming an opening by etching a portion of the conductive support substrate that overlaps with the recess of the insulating layer, removing a portion of the insulating layer that is exposed through the opening of the conductive support substrate such that a portion of the conductor layer that is formed inside of the recess of the insulating layer is exposed.

In this case, since the portion of the conductor layer is exposed through the opening of the conductive support substrate, a terminal of an external circuit can be connected to the conductor layer through the opening of the conductive support substrate. According to the present invention, formation of the hole that penetrates the bottom surface of the recess of the insulating layer is prevented, so that a portion of the conductor layer is prevented from being removed together with a portion of the conductive support substrate by etching in the step of forming the opening of the conductive support substrate. Thus, the signal transmission performance in the conductor layer is ensured.

(11) A printed circuit board includes an insulating layer, and a conductor layer that is formed on the insulating layer, wherein the insulating layer has a recess that is formed by the method according to another aspect of the prevent invention.

In the printed circuit board, the recess is formed in the insulating layer by the method according to the one aspect of the present invention described above, so that formation of a hole that penetrates a bottom surface of the recess of the insulating layer is prevented.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWING

FIG. 2 is a cross sectional view taken along the line A-A of the suspension board of FIG. 1;

FIGS. 5(a) to 5(d) are cross sectional views for illustrating steps of a method for manufacturing the suspension board;

DESCRIPTION OF THE PREFERRED EMBODIMENTS

A printed circuit board and a method of manufacturing the printed circuit board according to one embodiment of the present invention will be described below with reference to the drawings. The printed circuit board according to the embodiment described below is a suspension board with circuits used for an actuator of a hard disc drive (hereinafter abbreviated as a suspension board).

(1) CONFIGURATION OF SUSPENSION BOARD

Figure 1:
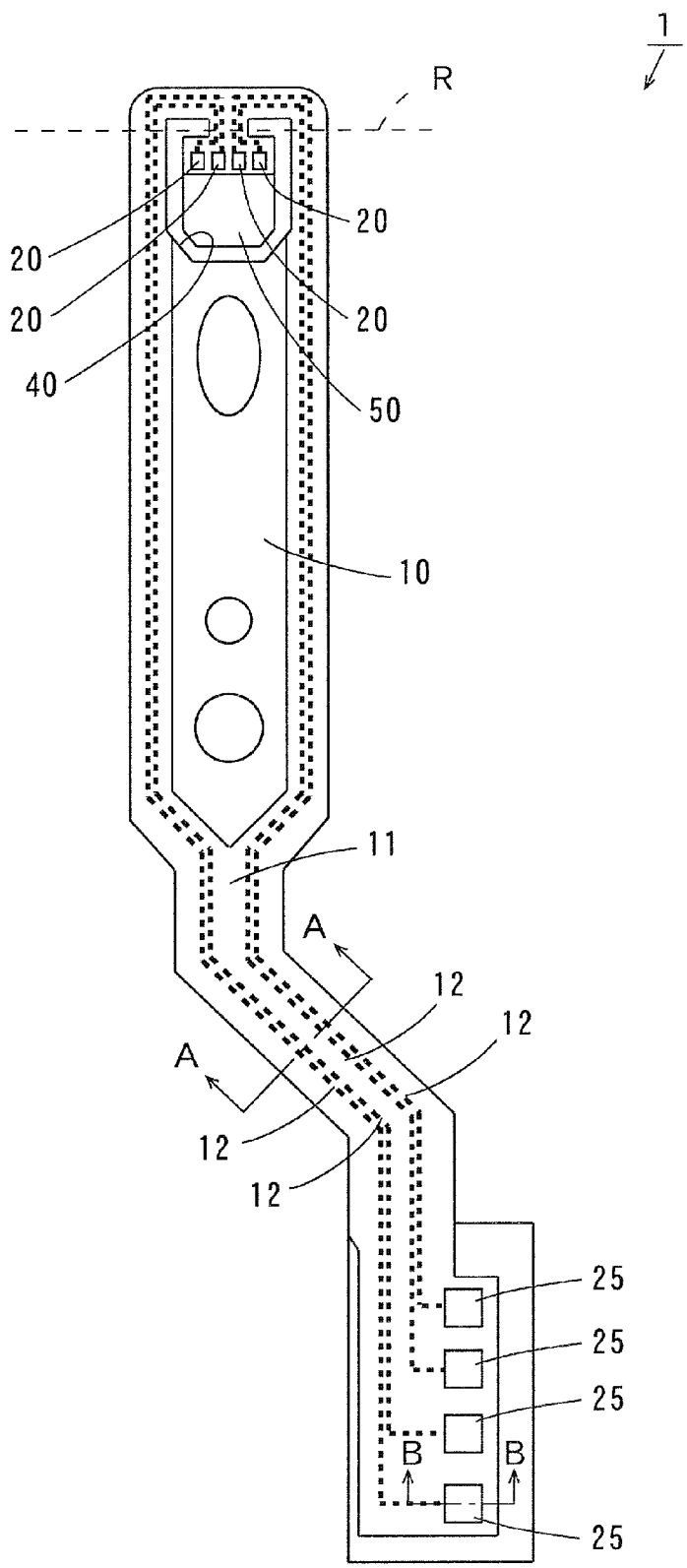
FIG. 1 is a plan view of a suspension board according to the present embodiment.

FIG. 1 is a plan view of the suspension board according to the present embodiment. FIG. 2 is a cross sectional view taken along the line A-A of the suspension board of FIG. 1. As shown in FIGS. 1 and 2, a suspension board 1 includes a long-sized support substrate 10 made of stainless steel (SUS), for example. At the tip of the support substrate 10, a magnetic head supporting portion (hereinafter referred to as a tongue) 50 is provided by forming a U-shaped opening 40. The tongue 50 is bent along the broken line R to form a predetermined angle with respect to the support substrate 10.

A base insulating layer 11 made of polyimide, for example, is formed on the support substrate 10. Four conductor traces 12, for example, are formed on the base insulating layer 11.

The two of the four conductor traces 12 are formed to extend along one lateral side of the support substrate 10, and the other two of the four conductor traces 12 are formed to extend along the other lateral side of the support substrate 10. As shown in FIG. 2, the conductor traces 12 include signal transmission portions 21 that are formed on the base insulating layer 11, and metal coatings 22 that are formed to cover surfaces of the signal transmission portions 21. The signal transmission portions 21 are made of copper, for example, and the metal coatings 22 are made of nickel, for example. A cover insulating layer 13 made of polyimide, for example, is formed to cover the conductor traces 12.

Four electrode pads 20 are formed on the tongue 50. Further, four electrode pads 25 are formed on the other end of the support substrate 10. The four electrode pads 20 and the four electrode pads 25 are electrically connected by the four conductor traces 12, respectively.

(2) ELECTRODE PADS

Figure 3:
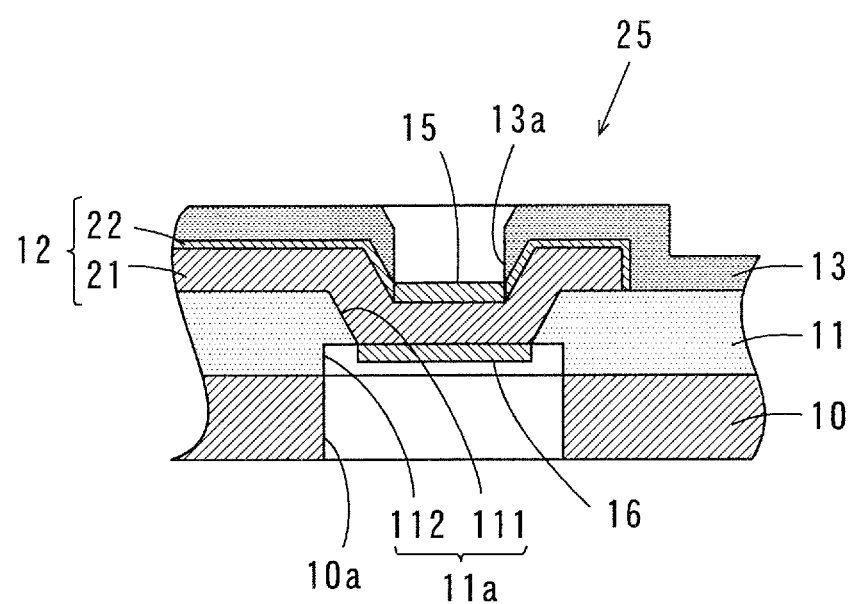
FIG. 3 is a cross sectional view taken along the line B-B of the suspension board of FIG. 1.

The detailed configuration of the electrode pads 20, 25 and their peripheral portions will be described. FIG. 3 is a cross sectional view taken along the line B-B of the suspension board 1 of FIG. 1 and shows the one electrode pad 25 and its peripheral portion. The configuration of each of the other electrode pads 25 and its peripheral portions and the configuration of each electrode pad 20 and its peripheral portions are similar to the configuration shown in FIG. 3.

As shown in FIG. 3, an opening 10a is formed in the support substrate 10. Further, an opening 11a is formed in a portion of the base insulating layer 11 that overlaps with the opening 10a. The opening 11a is constituted by an upper surface hole 111 that is formed to extend from the upper surface of the base insulating layer 11 to a certain depth, and a lower surface hole 112 that is formed to communicate with the upper surface hole 111 from the lower surface of the base insulating layer 11.

Figure 4:
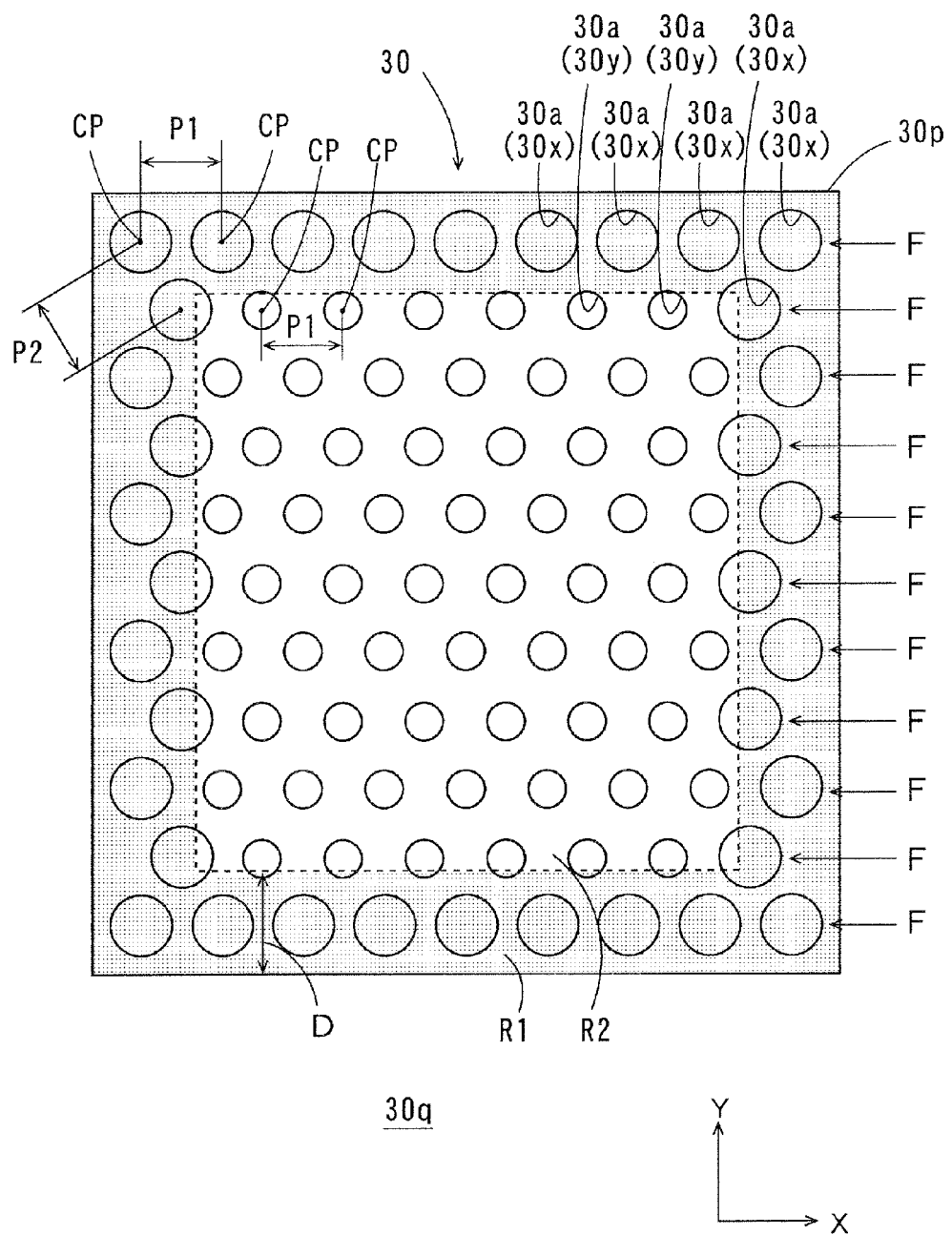
FIG. 4 is a plan view of part of a photomask.

The cross sectional area of the upper surface hole 111 is gradually reduced from the upper surface towards the lower surface of the base insulating layer 11. In the present embodiment, the upper surface hole 111 is formed by gradation exposure. In this case, a photomask 30 (FIG. 4) having partial light-transmitting regions 30p (only one partial light-transmitting region 30p is shown in FIG. 4) that are partially transmittable of the exposure light is used. The details of the photomask 30 will be described below.

The cross sectional area of the lower surface hole 112 is constant in the vertical direction and equal to the cross sectional area of the opening 10a of the support substrate 10. The inner peripheral surface of the lower surface hole 112 continuously extends to the inner peripheral surface of the opening 10a of the support substrate 10.

The signal transmission portion 21 of the conductor trace 12 is formed to extend through the upper surface of the base insulating layer 11 and the inner peripheral surface of the upper surface hole 111. In this case, a portion of the lower surface of the signal transmission portion 21 is exposed through the lower surface hole 112 and the opening 10a of the support substrate 10. A plating layer 16 made of nickel and gold, for example, is formed to cover the exposed portion of the lower surface of the signal transmission portion 21.

An opening 13a is formed in a portion of the cover insulating layer 13 that overlaps with the opening 11a. Further, a portion of the metal coating 22 that overlaps with the opening 13a is removed. Therefore, a portion of the upper surface of the signal transmitting portion 21 is exposed through the opening 13a. A plating layer 15 made of nickel and gold, for example, is formed on the exposed portion of the upper surface of the signal transmission portion 21.

Thus, the electrode pads 20, 25 are formed as flying leads such that external circuits can be electrically connected to the conductor traces 12 both on the main surface (the upper surface) side and the back surface (the lower surface) side of the suspension board 1.

(3) PHOTOMASK

FIG. 4 is a plan view of part of a photomask 30. In FIG. 4, the two directions that are orthogonal to each other are defined as an X direction and a Y direction.

As shown in FIG. 4, the photomask 30 has the partial light-transmitting regions 30p (only one partial light-transmitting region 30p is shown in FIG. 4) that are partially transmittable of the exposure light, a light-transmitting region 30q that is transmittable of substantially all of the exposure light and a light-shielding region (not shown) that is not transmittable of the exposure light. In the example of FIG. 4, the partial light-transmitting region 30p is rectangular. The light-transmitting region 30q is provided to surround four sides of the partial light-transmitting region 30p. An average transmission amount of the exposure light per unit area of the partial light-transmitting region 30p is smaller than the average transmission amount of the exposure light per unit area of the light-transmitting region 30q.

A plurality of holes 30x, 30y are formed to make a plurality of rows arranged in the X direction in the partial light-transmitting region 30p of the photomask 30. In the following description, a row that is composed of the plurality of holes 30x, 30y arranged in the X direction is referred to as a hole row F. The plurality of hole rows F are arranged at equal intervals in the Y direction.

The diameter of each hole 30x is larger than the diameter of each hole 30y. The plurality of holes 30x are arranged to surround the plurality of holes 30y. Specifically, each hole 30x is arranged in an annular region R1 with a constant width D along a periphery of the partial light-transmitting region 30p, and each hole 30y is arranged in a region R2 inside of the region R1. Here, each hole 30x is arranged in the region R1, that is, a central point CP of each hole 30x is positioned in the region R1. Similarly, each hole 30y is arranged in the region R2, that is, a central point CP of each hole 30y is positioned in the region R2. The hatched pattern is applied to the region R1 in FIG. 4.

The average transmission amount of the exposure light per unit area of the region R1 is larger than the average transmission amount of the exposure light per unit area of the region R2. In this example, the hole rows F positioned at the opposite ends in the Y direction of the plurality of hole rows F are composed of only the plurality of holes 30x. In each of the other hole rows F, the holes 30x are positioned at the opposite ends in the X direction, and the plurality of holes 30y are positioned therebetween.

The transmission amount of the exposure light through each hole 30x is preferably not less than 1.1 times and not more than 1.5 times of the transmission amount of the exposure light through each hole 30y. The diameter of each hole 30y is not less than 4 μm and not more than 14 μm, for example and preferably not less than 6 μm and not more than 12 μm. The diameter of each hole 30x is not less than 1.05 times and not more than 1.40 times, for example and preferably not less than 1.05 times and not more than 1.30 times of the diameter of each hole 30y. The diameter of each hole 30x is not less than 1.05 times of the diameter of each hole 30y, whereby formation of a through hole in the base insulating layer 11 is prevented as described below. Further, the diameter of each hole 30x is not more than 1.40 times of each hole 30y, whereby the gradation exposure can be reliably performed on the base insulating layer 11.

In the following description, each hole 30x, 30y is collectively termed a hole 30a. In each hole row F, pitches P1 of the plurality of holes 30a are set uniformly. Here, the pitch P1 refers to a distance between the central point CP of the one hole 30a of the two adjacent holes 30a and the central point CP of the other hole 30a of the two adjacent holes 30a.

Further, the plurality of holes 30a of the one hole row F and the plurality of holes 30a of the other hole row F that is adjacent to the one hole row F are arranged in a staggered manner. Specifically, a position of the central point CP of each hole 30a of the other hole row F that is adjacent to the one hole row F, is set to misalign for a half of the pitch P1 described above in the X direction with respect to a position of the central point CP of each hole 30a of the one hole row F.

Further, in each two adjacent hole rows F, a pitch P2 between each hole 30a of the one hole row F and the hole 30a of the other hole row F that is the closest thereto, is set equal to the pitch P1 described above.

The pitches P1, P2 are not less than 6 μm and not more than 28 μm, for example and preferably not less than 7 μm and not more than 28 μm. The pitches P1, P2 are not less than 6 μm, whereby dimensional accuracy of each hole 30a is ensured. Thus, as described below, formation of a through hole in the base insulating layer 11 is prevented. Further, the pitches P1, P2 are not more than 28 μm, whereby the gradation exposure can be reliably performed on the base insulating layer 11.

(4) MANUFACTURING METHOD

Figure 6:
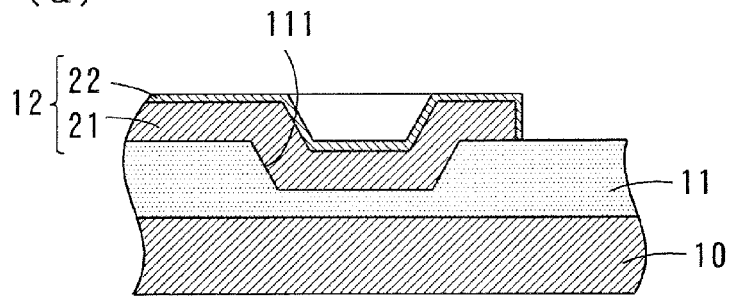
FIGS. 6(a) to 6(d) are cross sectional views for illustrating the steps in the method of manufacturing the suspension board.
Figure 6:
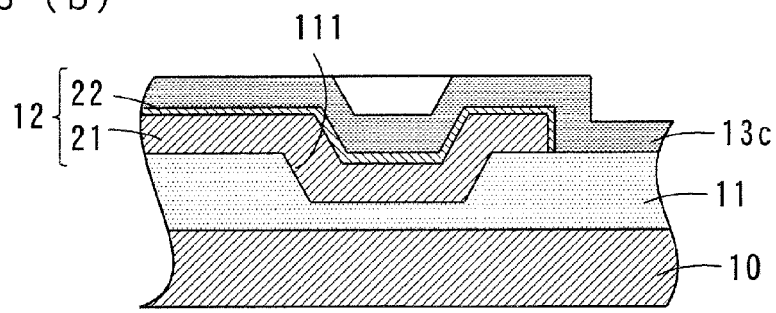
Figure 6:
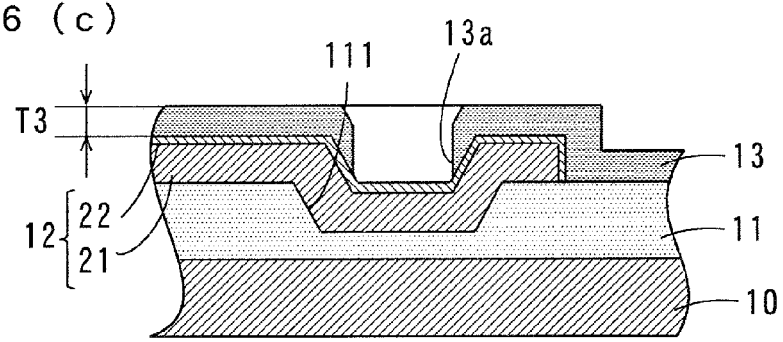
Figure 6:
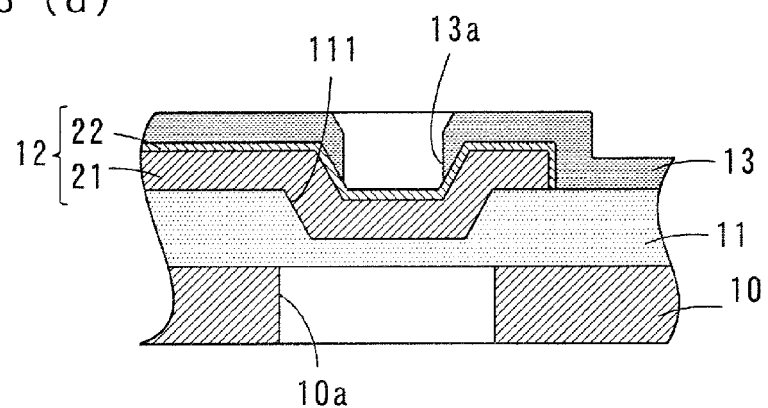
Figure 7:
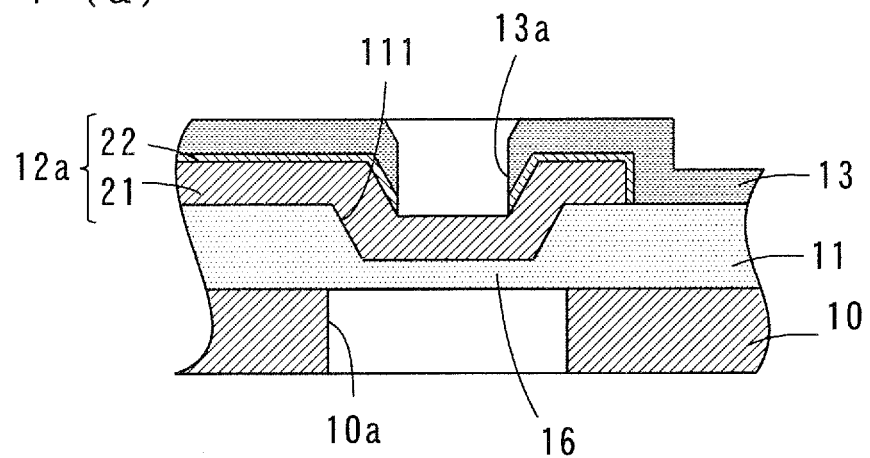
FIGS. 7(a) to 7(c) are cross sectional views for illustrating the steps in the method of manufacturing the suspension board.
Figure 7:
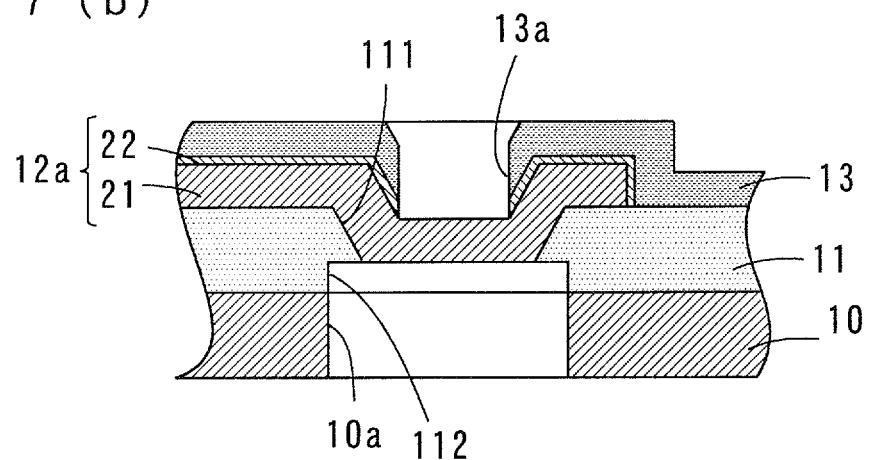
Figure 7:
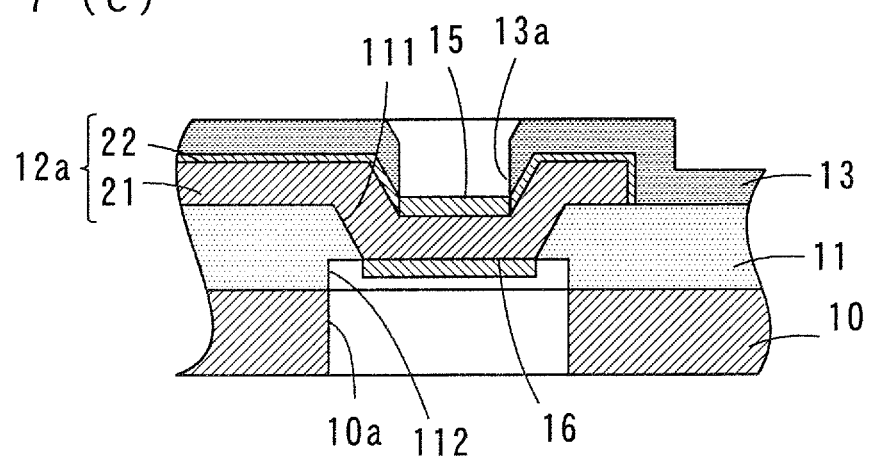

FIGS. 5 to 7 are cross sectional views for illustrating steps of the method for manufacturing the suspension board 1. In FIGS. 5 to 7, the manufacturing steps of the one electrode pad 25 and its peripheral portion of FIG. 3 are shown. The manufacturing steps of the other electrode pads 25 and their peripheral portions and the manufacturing steps of each electrode pad 20 and its peripheral portion are similar to the manufacturing steps shown in FIGS. 5 to 7.

As shown in FIG. 5(a), the support substrate 10 is prepared, and an insulating layer 11c is formed on the support substrate 10 as a precursor of the base insulating layer 11. Metal material such as stainless steel or aluminum, for example, is used as the material for the support substrate 10. The thickness of the support substrate 10 is not less than 5 μm and not more than 50 μm, for example and preferably not less than 10 μm and not more than 30 μm.

As material for the insulating layer 11c, negative photosensitive resin is used. For example, photosensitive polyimide resin or photosensitive epoxy resin is used. The support substrate 10 is coated with photosensitive resin solution and the solution is heated such that the insulating layer 11c is formed, for example. The temperature to which the solution is heated is not less than 60° C. and not less than 150° C., for example and preferably not less than 80° C. and not less than 120° C.

Then, as shown in FIG. 5(b), exposure processing is performed on the insulating layer 11c using the photomask 30 of FIG. 4. In this case, the partial light-transmitting region 30p is arranged to be opposite to a portion of the insulating layer 11c where the upper surface hole 111 is to be formed, the light-transmitting region 30q is arranged to be opposite to a portion of the insulating layer 11c where a constant thickness is to be maintained and the light-shielding region (not shown) is arranged to be opposite to a portion of the insulating layer 11c to be removed. The exposure light is transmitted through the partial light-transmitting region 30p and enters the portion of the insulating layer 11c that is opposite to the partial light-transmitting region 30p, the exposure light is transmitted through the light-transmitting region 30q and enters the portion of the insulating layer 11c that is opposite to the light-transmitting region 30q, and the exposure light does not enter the portion of the insulating layer 11c that is opposite to the light-shielding region. In this way, the gradation exposure is performed on the insulating layer 11c.

After the exposure processing, the insulating layer 11c is heated to not less than 150° C. and not more than 180° C., for example. Thus, portions of the insulating layer 11c where the exposure light has entered become insoluble during the following development processing.

A wavelength of the exposure light is not less than 300 nm and not more than 450 nm, for example and preferably not less than 350 nm and not more than 420 nm. Further, the accumulated amount of the exposure light is not less than 100 mj/cm$^2$ and not more than 1500 mj/cm$^2$, for example and preferably not less than 100 mj/cm$^2$ and not more than 500 mj/cm$^2$. The accumulated amount of the exposure light is not less than 100 mj/cm$^2$, so that necessary thicknesses of the base insulating layer 11 can be ensured. On the other hand, the accumulated amount of the exposure light is not more than 1500 mj/cm$^2$, so that the thicknesses of the base insulating layer 11 are prevented from becoming unnecessarily large.

Next, the development processing is performed on the insulating layer 11c after the exposure processing and the insulating layer 11c after the development processing is heated to 250° C., for example, such that the insulating layer 11c is cured (imidization). Thus, the base insulating layer 11 having a predetermined pattern is formed. Further, as shown in FIG. 5(c), the upper surface hole 111 is formed in a portion of the base insulating layer 11 where the electrode pad 25 is to be formed. The thickness T1 of the base insulating layer 11 is not less than 3 μm and not more than 20 μm, for example and preferably not less than 5 μm and not more than 15 μm. Further, the depth T2 of the upper surface hole 111 is not less than 20% of the thickness T1 of the base insulating layer 11, for example, and specifically preferably not less than 2 μm and not more than 5 μm.

Then, as shown in FIG. 5(d), the signal transmission portion 21 having a predetermined pattern is formed on the base insulating layer 11. In this case, any of a subtractive method, an additive method, a semiadditive method and the like can be used. In a portion where the electrode pad 25 is to be formed, the signal transmission portion 21 is formed to pass through an inner peripheral surface and a bottom surface of the upper surface hole 111.

Metal such as copper, gold (Au) or aluminum, or an alloy such as a copper alloy and an aluminum alloy, for example, is used as the material for the signal transmission portion 21. The thickness T3 of the signal transmission portion 21 is not less than 3 μm and not more than 16 μm, for example and preferably not less than 6 μm and not more than 13 μm.

Then, as shown in FIG. 6(a), the metal coating 22 is formed by electroless nickel plating, for example, so as to cover the surface of the signal transmission portion 21. Thus, the conductor trace 12 constituted by the signal transmission portion 21 and the metal coating 22 is formed. The thickness of the metal coating 22 is not less than 0.05 μm and not more than 0.1 μm, for example.

Next, as shown in FIG. 6(b), an insulating layer 13c is formed as a precursor of the cover insulating layer 13 so as to cover the conductor trace 12. Similarly to the insulating layer 11c, the negative photosensitive resin, for example, is used as the material for the insulating layer 13c.

Then, as shown in FIG. 6(c), similarly to the insulating layer 11c, the exposure processing and the development processing are performed on the insulating layer 13c, and the insulating layer 13c after the development processing is cured by heating, whereby the cover insulating layer 13 having a predetermined pattern is formed. The opening 13a is formed in a portion of the cover insulating layer 13 where the electrode pad 25 is to be formed. Thus, a portion of the metal coating 22 is exposed through the opening 13a. The thickness T3 of the cover insulating layer 13 is not less than 5 μm and not more than 30 μm, for example and preferably not less than 10 μm and not more than 20 μm.

Next, as shown in FIG. 6(d), the opening 10a is formed in the support substrate 10 by chemical etching, for example. Thus, a portion of the base insulating layer 11 where the lower surface hole 112 is to be formed is exposed through the opening 10a. An opening 40 of FIG. 1 and so on are also formed simultaneously.

Then, as shown in FIG. 7(a), a portion of the metal coating 22 that is exposed through the opening 13a of the cover insulating layer 13 is removed by stripping, for example. Thus, a portion of the upper surface of the signal transmission portion 21 is exposed through the opening 13a. Next, as shown in FIG. 7(b), the lower surface hole 112 is formed by plasma etching, for example, in a portion of the base insulating layer 11 that is exposed through the opening 10a of the support substrate 10. Thus, a portion of the lower surface of the signal transmission portion 21 is exposed through the lower surface hole 112.

Next, as shown in FIG. 7(c), the plating layer 15 is formed on the portion of the upper surface of the signal transmission portion 21 that is exposed through the opening 13a of the cover insulating layer 13, and the plating layer 16 is formed on a portion of the lower surface of the signal transmission portion 21 that is exposed through the opening 10a of the support substrate 10 and the lower surface hole 112 of the base insulating layer 11. Each of the plating layers 15, 16 is formed by successively performing electrolytic nickel plating and electrolytic gold plating, for example. The thickness of each of the plating layers 15, 16 is not less than 1 μm and not more than 10 μm, for example. As the material for the plating layers 15, 16, only one of nickel and gold may be used, or another metal material such as tin may be used. In this way, the suspension board 1 having the electrode pads 20, 25 is fabricated.

(5) COMPARATIVE EXAMPLE

Figure 8:
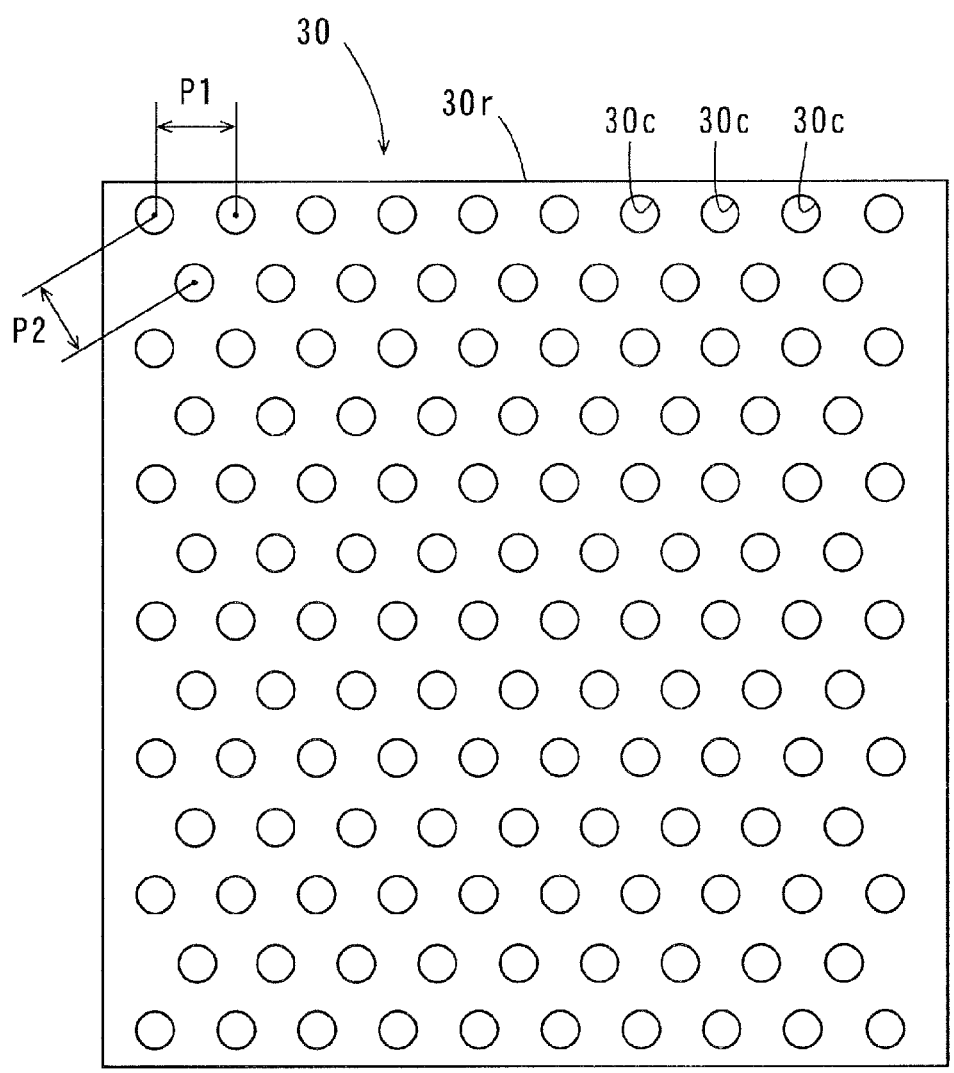
FIG. 8 is a plan view of a comparative example of a photomask.

FIG. 8 is a plan view of the comparative example of the photomask 30. As for the photomask 30 of FIG. 8, the difference from the photomask 30 of FIG. 4 will be described. The photomask 30 of FIG. 8 has partial light-transmitting regions 30r (only one partial light-transmitting region 30r is shown in FIG. 8) instead of the partial light-transmitting regions 30p. In the partial light-transmitting regions 30r, a plurality of holes 30c are formed instead of the plurality of holes 30x, 30y. The diameters of the plurality of holes 30c are equal to each other and set to less than 4 μm, respectively. Further, the pitches P1, P2 of the plurality of holes 30c are set to less than 6 μm.

Figure 9:
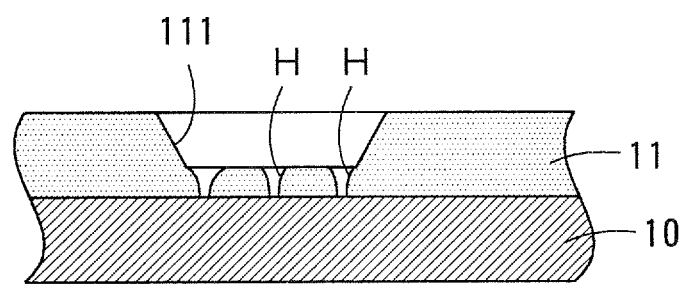
FIGS. 9(a) to 9(c) are diagrams for explaining a problem that arises in performing gradation exposure on an insulating layer using the photomask of FIG. 8.
Figure 9:
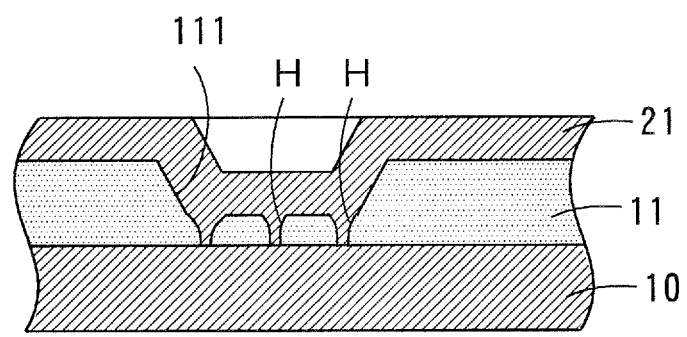
Figure 9:
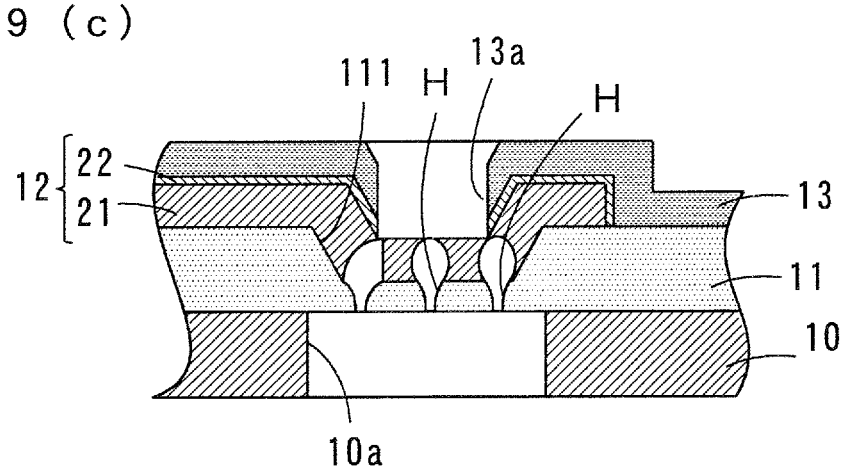

When the photomask 30 of FIG. 8 is used instead of the photomask 30 of FIG. 4, the following problem may occur. FIGS. 9 (a) to 9(c) are diagrams for explaining the problem that may occur when the gradation exposure is performed on the base insulating layer 11 (the insulating layer 11c) using the photomask 30 of FIG. 8.

Since the diameter of each hole 30c in the partial light-transmitting region 30r is set to less than 4 μm in the photomask 30 of FIG. 8, the diameters of the plurality of holes 30c are likely to have variation in fabricating the photomask 30. In this case, the transmission amount of the exposure light through part of the partial light-transmitting region 30r may be smaller than the transmission amount of the exposure light through the remaining part of the partial light-transmitting region 30r. Therefore, the amount of the exposure light incidence in part of the region in the insulating layer 11c where the upper surface hole 111 is to be formed may be smaller than the necessary amount. Thus, as shown in FIG. 9(a), holes H that penetrate the bottom surface of the upper surface hole 111 may be formed during the development processing (the step of FIG. 5(c)). In particular, the holes H are likely to be formed at a periphery of the bottom surface of the upper surface hole 111 due to the development promoter used during the development processing.

If the holes H are formed in the base insulating layer 11, the signal transmission portion 21 is formed to fill in the holes H as shown in FIG. 9(b) (the step of FIG. 5(d)). In this case, the support substrate 10 and the signal transmission portion 21 are electrically connected to each other through the holes H. Therefore, when the opening 10a is formed in the support substrate 10 by etching (the step of FIG. 6(d)), the parts of the signal transmission portion 21 in the holes H and peripheries of the holes H are removed together with part of the support substrate 10 as shown in FIG. 9(c). As a result, appearance is ruined. Further, the surface of the plating layer 16 that is to be formed in the following step is not flat, so that the connection failure may occur when a terminal of the external circuit is connected to the plating layer. 16.

(6) EFFECTS OF PRESENT EMBODIMENT

In the present embodiment, the gradation exposure is performed on the insulating layer 11c using the photomask 30 having the partial light-transmitting regions 30p. In each of the partial light-transmitting region 30p, the plurality of holes 30x are arranged in the annular region R1, and the plurality of holes 30y having smaller diameters than the holes 30x are arranged in the region R2, inside of the region R1.

In this case, the average transmission amount of the exposure light per unit area of the region R1 is larger than the average transmission amount of the exposure light per unit area of the region R2. Therefore, a periphery of the portion of the insulating layer 11c where the upper surface hole 111 is to be formed, more likely to be dissolved during the development processing, is irradiated with a larger amount of the exposure light than the remaining region. Thus, formation of the hole H that penetrates the bottom surface of the upper surface hole 111 is prevented.

Further, the transmission amount of the exposure light through each hole 30x is not less than 1.1 times and not more than 1.5 times of the transmission amount of the exposure light through each hole 30y, whereby the portion of the insulating layer 11c where the upper surface hole 111 is to be formed is appropriately irradiated with the necessary amount of the exposure light through the plurality of holes 30x, 30y. Thus, the upper surface hole 111 can be well formed.

Further, the diameter of each hole 30y is not less than 4 μm, whereby the diameters of the plurality of holes 30y are prevented from having variation in fabricating the photomask 30. Therefore, the insulating layer 11c can be irradiated with the necessary amount of the exposure light through the plurality of holes 30y. Thus, formation of the hole H that penetrates the bottom surface of the upper surface hole 111 can be more reliably prevented. Further, the diameter of each hole 30y is not more than 14 μm, whereby the insulating layer 11c is prevented from being excessively irradiated with the exposure light through the plurality of holes 30y.

Further, because the pitches P1, P2 of the plurality of holes 30x, 30y are not less than 6 μm and not more than 28 μm, the portion of the insulating layer 11c where the upper surface hole 111 is to be formed is appropriately irradiated with the necessary amount of the exposure light while the dimension accuracy of each hole 30x, 30y is ensured.

Further, because the plurality of holes 30x, 30y of the one hole row F and the plurality of holes 30x, 30y of the other hole row F that is adjacent to the one hole row F are arranged in a staggered manner, the insulating layer 11c can be evenly irradiated with the exposure light through the plurality of holes 30x and the insulating layer 11c can be evenly irradiated with the exposure light through the plurality of holes 30y. Thus, the upper surface hole 111 can be well formed.

(7) INVENTIVE EXAMPLES AND COMPARATIVE EXAMPLES

(7-1) Inventive Examples 1 to 3

As the inventive examples 1 to 3, the exposure processing was performed on the insulating layer 11c using the photomask 30 of FIG. 4. In the inventive example 1, the diameter of each hole 30y was 8 μm, the diameter of each hole 30x was 1.2 times of the diameter of each hole 30y and the pitches P1, P2 were 14.5 μm. In the inventive example 2, the diameter of each hole 30y was 4 μm, the diameter of each hole 30x was 1.08 times of the diameter of each hole 30y and the pitches P1, P2 were 8.5 μm. In the inventive example 3, the diameter of each hole 30y was 12 μm, the diameter of each hole 30x was 1.38 times of the diameter of each hole 30y and the pitches P1, P2 were 25 μm.

(7-2) Comparative Example

As the comparative example, the exposure processing was performed on the insulating layer 11c using the photomask 30 of FIG. 8. In the comparative example, the diameter of each hole 30c was 3 μm and the pitches P1, P2 were 5 μm.

(7-3) Evaluation

In the inventive examples 1 to 3, the hole H that penetrates the bottom surface of the upper surface hole 111 was not formed. On the other hand, in the comparative example, the holes H that penetrate the bottom surface of the upper surface hole 111 were formed. Therefore, it was understood that formation of the hole H that penetrates the bottom surface of the upper surface hole 111 was prevented by using the photomask 30 of the FIG. 4.

(8) OTHER EMBODIMENTS

8-1

While the average transmission amount of the exposure light per unit area of the region R1 is larger than the average transmission amount of the exposure light per unit area of the region R2 in the embodiment described above because the pitches of the plurality of holes 30x arranged in the region R1 of the photomask 30 and the pitches of the plurality of holes 30y arranged in the region R2 are equal to each other, and the diameter of each hole 30x is larger than the diameter of each hole 30y, a method of adjusting the transmission amount of the exposure light is not limited to this. For example, the average transmission amount of the exposure light per unit area of the region R1 may be larger than the average transmission amount of the exposure light per unit area of the region R2 because the diameter of each hole 30x and the diameter of each hole 30y are equal to each other and the pitches of the plurality of holes 30x may be smaller than the pitches of the plurality of holes 30y.

8-2

While the transmission amount of the exposure light through each hole 30x is larger than the transmission amount of the exposure light through each hole 30y because the diameter of each hole 30x is larger than the diameter of each hole 30y, the method of adjusting the transmission amount of the exposure light is not limited to this. For example, light-transmitting portions made of material having light transmission properties may be provided in the regions R1, R2 of the partial light-transmitting portion 30p instead of the holes 30x, 30y, and the light-transmitting portion of the region R1 may be formed of the material having higher light transmission properties than the light-transmitting portion of the region R2.

8-3

While each of the plurality of holes 30x, 30y of the photomask 30 is circular in the embodiment described above, the invention is not limited to this. Each of the plurality of holes 30x, 30y of the photomask 30 may have another shape such as a triangle or a square.

8-4

While the plurality of holes 30x, 30y of the photomask 30 are arranged in a staggered manner in the embodiment described above, the invention is not limited to this. The plurality of holes 30x, 30y may be arranged in another manner such as a matrix manner. Further, if formation of the hole H that penetrates the bottom surface of the upper surface hole 111 can be prevented, the pitches P1, P2 of the plurality of holes 30x, 30y do not have to be constant.

8-5

While the gradation exposure is performed using the photomask 30 of FIG. 4 in forming the base insulating layer 11 in the embodiment described above, the invention is not limited to this. The gradation exposure may be performed using the photomask 30 of FIG. 4 in forming another insulating layer such as the cover insulating layer 13.

8-6

While the embodiment described above is an example in which the present invention is applied to the manufacturing of the suspension board 1 for positioning the magnetic head with a desired track of a magnetic disc, the present invention may be applied to the manufacturing of another printed circuit board such as a flexible substrate.

(9) CORRESPONDENCES BETWEEN ELEMENTS IN THE CLAIMS AND PARTS IN EMBODIMENTS

In the following paragraphs, non-limiting examples of correspondences between various elements recited in the claims below and those described above with respect to various preferred embodiments of the present invention are explained.

In the embodiment described above, the suspension board 1 is an example of a printed circuit board, the base insulating layer 11 (the insulating layer 11c) is an example of an insulating layer, the signal transmission portion 21 is an example of a conductor layer, the photomask 30 is an example of a photomask, the partial light-transmitting region 30p is an example of a partial light-transmitting region, the upper surface hole 111 is an example of a recess, the region R2 is an example of a first region, the region R1 is an example of a second region, the hole 30y is an example of a first light-transmitting portion, the hole 30x is an example of a second light-transmitting portion, the upper surface is an example of a first surface, the lower surface is an example of a second surface, the support substrate 10 is an example of a conductive support substrate and the opening 10a is an example of an opening.

While preferred embodiments of the present invention have been described above, it is to be understood that variation and modifications will be apparent to those skilled in the art without departing the scope and spirit of the present invention. The scope of the present invention, therefore, is to be determined solely by the following claims.

I claim:

1. A method of manufacturing a printed circuit board that includes an insulating layer and a conductor layer having a predetermined pattern, the method comprising the steps of:
    performing gradation exposure to irradiate said insulating layer with exposure light using a photomask having a partial light-transmitting region that is configured to partially transmit the exposure light; and
    performing development processing on said insulating layer such that a recess is formed in a portion of said insulating layer that has been irradiated with the exposure light through said partial light-transmitting region,
    wherein said partial light-transmitting region of said photomask includes:
        a first region including a plurality of first light-transmitting portions that are transmittable of the exposure light, and
        a second region that is provided to surround said first region, a plurality of second light-transmitting portions that are transmittable of the exposure light being provided in the second region; and
    wherein a relationship between a diameter of each of the plurality of first light-transmitting portions and a diameter of each of the plurality of second light-transmitting portions and a relationship between pitches of the plurality of first light-transmitting portions and pitches of the plurality of second light-transmitting portions are set such that an average transmission amount of the exposure light per unit area of said second region is larger than an average transmission amount of the exposure light per unit area of said first region.

2. The method of manufacturing the printed circuit board according to claim 1, wherein
    the recess of said insulating layer has an inner side surface and a bottom surface, and
    a thickness of a portion of said insulating layer that constitutes said bottom surface is constant.

3. The method of manufacturing the printed circuit board according to claim 1, wherein
    a transmission amount of the exposure light through each second light-transmitting portion is larger than a transmission amount of the exposure light through each first light-transmitting portion.

4. The method of manufacturing the printed circuit board according to claim 1, wherein the transmission amount of the exposure light through each second light-transmitting portion is not less than 1.1 times and not more than 1.5 times of the transmission amount of the exposure light through each first light-transmitting portion.

5. The method of manufacturing the printed circuit board according to claim 1, wherein each first light-transmitting portion and each second light-transmitting portion are circular, respectively.

6. The method of manufacturing the printed circuit board according to claim 5, wherein a diameter of each first light-transmitting portion is not less than 4 μm and not more than 14 μm.

7. The method of manufacturing the printed circuit board according to claim 1, wherein a distance between a central point of one first light-transmitting portion and a central point of another first light-transmitting portion that is the closest to the one first light-transmitting portion is not less than 6 μm and not more than 28 μm.

8. The method of manufacturing the printed circuit board according to claim 1, wherein a distance between a central point of one second light-transmitting portion and a central point of another second light-transmitting portion that is the closest to the one second light-transmitting portion is not less than 6 μm and not more than 28 μm.

9. The method of manufacturing the printed circuit board according to claim 1,
    wherein said plurality of first and second light-transmitting portions form a plurality of rows, and
    wherein a plurality of first and second light-transmitting portions in one row of said plurality of rows and a plurality of first and second light-transmitting portions in another row adjacent to the one row are arranged in a staggered manner.

10. The method of manufacturing the printed circuit board according to claim 1, wherein said insulating layer is formed on a conductive support substrate and has a first surface that is to be irradiated with the exposure light and a second surface that is in contact with said conductive support substrate, and
    the method further comprising the steps of:
    forming said conductor layer to extend to an inside of said recess of said insulating layer and onto the first surface of said insulating layer after the development processing;
    forming an opening by etching a portion of said conductive support substrate that overlaps with said recess of said insulating layer; and
    removing a portion of said insulating layer that is exposed through said opening of said conductive support substrate such that a portion of said conductor layer that is formed inside of said recess of said insulating layer is exposed.

11. The method of manufacturing the printed circuit board according to claim 1, wherein the diameter of each second light-transmitting portion is larger than the diameter of each first light-transmitting portion.

12. The method of manufacturing the printed circuit board according to claim 1, wherein the pitches of the plurality of second light-transmitting portions are smaller than the pitches of the plurality of first light-transmitting portions.

* * * * *